United States Patent
Ramm et al.

(10) Patent No.: US 11,584,984 B2
(45) Date of Patent: Feb. 21, 2023

(54) PROTECTIVE COATING FOR A THERMALLY STRESSED STRUCTURE

(71) Applicants: Siemens Energy Global GmbH & Co. KG, Munich (DE); Oerlikon Surface Solutions AG, Pfäffikon, Pfäffikon (CH)

(72) Inventors: Jürgen Ramm, Maienfeld (CH); Werner Stamm, Mülheim an der Ruhr (DE)

(73) Assignee: SIEMENS ENERGY GLOBAL GMBH & CO. KG, Munich (DE)

(*) Notice: Subject to any disclaimer, the term of this patent is extended or adjusted under 35 U.S.C. 154(b) by 558 days.

(21) Appl. No.: 16/316,164

(22) PCT Filed: Jun. 23, 2017

(86) PCT No.: PCT/EP2017/065493
§ 371 (c)(1),
(2) Date: Jan. 8, 2019

(87) PCT Pub. No.: WO2018/010936
PCT Pub. Date: Jan. 18, 2018

(65) Prior Publication Data
US 2021/0214838 A1 Jul. 15, 2021

(30) Foreign Application Priority Data
Jul. 14, 2016 (DE) .................... 10 2016 212 874.4

(51) Int. Cl.
*C23C 14/32* (2006.01)
*C23C 14/08* (2006.01)
(Continued)

(52) U.S. Cl.
CPC ............ *C23C 14/081* (2013.01); *C23C 14/14* (2013.01); *C23C 14/325* (2013.01);
(Continued)

(58) Field of Classification Search
None
See application file for complete search history.

(56) References Cited

U.S. PATENT DOCUMENTS

| | | | |
|---|---|---|---|
| 2002/0102400 A1* | 8/2002 | Gorokhovsky | ....... C23C 14/081 510/307 |
| 2004/0168637 A1* | 9/2004 | Gorokhovsky | ..... C23C 14/0647 118/723 ER |

(Continued)

FOREIGN PATENT DOCUMENTS

| | | |
|---|---|---|
| AU | 2007306494 B2 | 4/2008 |
| DE | 102008026358 A1 | 12/2009 |

(Continued)

OTHER PUBLICATIONS

Amarendra K. Rai et al: "CMAS-Resistant Thermal Barrier Coatings (TBC)", International Journal of Applied Ceramic Technology, vol. 7, No. 5, Sep. 1, 2010 (Sep. 1, 2010), pp. 662-674, XP055023168, ISSN: 1546-542X, DOI:10.1111/j.1744-7402.2009.02373.x,; 2010.

(Continued)

*Primary Examiner* — Jason Berman
(74) *Attorney, Agent, or Firm* — Schmeiser, Olsen & Watts LLP

(57) ABSTRACT

Provided is a method for arranging a protective coating for a thermally stressed structure, having at least one layer of alpha-aluminium oxide or of element-modified alpha-aluminium oxide, and wherein the protective coating is applied by reactive cathodic arc vaporization. A protective coating produced by the method and a component having a protective coating is also provided.

9 Claims, 2 Drawing Sheets

(51) Int. Cl.
*C23C 14/14* (2006.01)
*C23C 14/34* (2006.01)
*C23C 28/00* (2006.01)
*F01D 5/28* (2006.01)

(52) U.S. Cl.
CPC ........ *C23C 14/3414* (2013.01); *C23C 28/321* (2013.01); *F01D 5/288* (2013.01); *F05D 2230/90* (2013.01)

(56) References Cited

U.S. PATENT DOCUMENTS

| | | | | |
|---|---|---|---|---|
| 2005/0276990 | A1* | 12/2005 | Kohara | C23C 28/34 428/469 |
| 2006/0257688 | A1* | 11/2006 | Schutze | C23C 28/3455 428/697 |
| 2011/0151219 | A1* | 6/2011 | Nagaraj | C23C 28/345 428/215 |
| 2011/0182681 | A1 | 7/2011 | Schier et al. | |
| 2015/0064430 | A1 | 3/2015 | Doebber | |

FOREIGN PATENT DOCUMENTS

| | | |
|---|---|---|
| DE | 102013217627 A1 | 3/2015 |
| EP | 2166128 A1 | 3/2010 |
| EP | 2166128 B1 | 11/2011 |
| WO | 2008043606 A1 | 4/2008 |
| WO | WO 2008043606 A1 | 4/2008 |

OTHER PUBLICATIONS

Nianqiang Wu et al: "Hot CorrosionMechanism of Composite Alumina/Yttria-Stabilized Zirconia Coatingin Malten Sulfate-Vanadate Salt", Journal of the American Ceramic Society., Bd. 88, Nr. 3, Seiten 675-682, XP055410290, US, ISSN: 0002-7820, DOI: 10.1111/j.1551-2916.2005.00120.x Seite 675, linke Spalte, Absatz 2 Seite 676, rechte Spalte; Abbildung 2C Conclusion (4); Seite 682; 2005.
Non-English PCT International Search Report and Written Opinion of International Searching Authority dated Oct. 6, 2017 corresponding to PCT International Application No. PCT/EP2017/065493 filed Jun. 23, 2017.

* cited by examiner

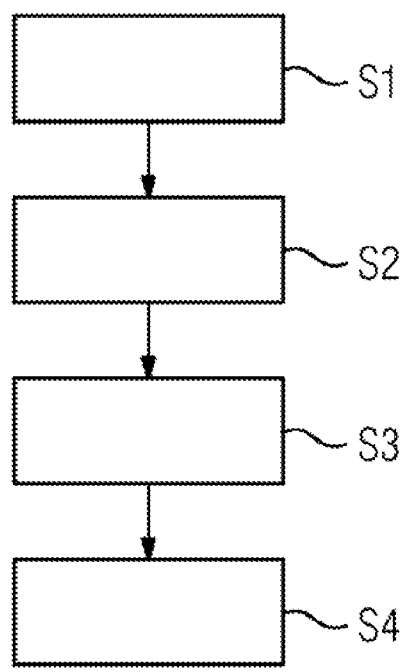

PROTECTIVE COATING FOR A THERMALLY STRESSED STRUCTURE

CROSS REFERENCE TO RELATED APPLICATIONS

This application claims priority to PCT Application No. PCT/EP2017/065493, having a filing date of Jun. 23, 2017, based off of German Application No. 10 2016 212 874.4, having a filing date of Jul. 14, 2016, the entire contents of which are hereby incorporated by reference.

FIELD OF TECHNOLOGY

The following relates to a method for arranging a protective coating on a thermally stressed structure which is produced by means of cathodic arc evaporation.

BACKGROUND

For the protection of components which are exposed to high temperatures thermal barrier coatings (TBC) are used in order to lower the material temperature during high-temperature use. Thermal barrier coatings are required for example in gas turbines which are exposed to very high operating temperatures. However, in modern gas turbines with high efficiency hot gas components which are coated with thermal barrier coatings, such as blades and combustion chamber parts, a temperature field is frequently formed, which temperature field enables coatings with constituents such as calcium, magnesium, aluminum and silicon to be deposited during operation. These deposits as generally referred to as CMAS, which is derived from the chemical symbols Ca, Mg, Al and Si. These coatings or parts of these coatings can chemically react with ceramic material of the thermal barrier coating and/or can penetrate into the thermal barrier coating. In this case, the thermal barrier coating is destroyed in the course of operation, e.g. of the corresponding gas turbine. Other coatings, which are formed from nickeliferous or ferriferous deposits from oil impurities, contaminated pipes or connections from the compressor, can also destroy the thermal barrier coating by hardening and/or embrittlement.

The forming of a CMAS liquid phase, for example by lining the thermal barrier coating with aluminum particles and direct interaction, is conventionally avoided by forming high-melting phases so that no product of the melt can penetrate into the pores of the thermal barrier coating. This type of coating usually requires an aftertreatment and requires a number of process steps.

SUMMARY

An aspect relates to applying a protective coating of the thermal barrier coating in as few steps as possible.

An aspect of the embodiments of the invention relates to a method for arranging a protective coating, comprising at least one first layer with aluminum oxide content, on a thermally stressed structure by means of cathodic arc evaporation, wherein the thermally stressed structure comprises at least one thermal barrier coating, featuring the steps:

S1) providing the thermally stressed structure in a coating chamber,
S2) providing a target in the coating chamber as a material source for the coating, wherein the target comprises at least aluminum,
S3) providing a controlled oxygen partial pressure in the coating chamber,
S4) igniting an arc so that material from the target is evaporated and deposited on the outer side of the thermal barrier coating of the thermally stressed structure, wherein the protective coating is applied as a homogenous alpha-aluminum oxide-based layer.

The expression target is a term known to the person skilled in the art for a material which in the aforesaid evaporation method is partially melted and evaporated.

The expression substrate is term known to the person skilled in the art for a material on which the evaporated target material is condensed and deposited so that a layer is deposited on the substrate. The substrate is represented here by the aforesaid thermal barrier coating.

The expression layer, if not expressly referred to otherwise, refers here to a layer which is a component part of the protective coating.

A layer, which in addition to Al can also contain further elements, is to be understood here by an aluminum oxide-based layer.

The method of reactive cathodic arc evaporation (reactive CAE) is known to the person skilled in the art. In the method, an aluminum oxide-based layer is basically deposited on a thermal barrier coating, wherein the target, which is operated as a cathode during the arc evaporation, is evaporated. The evaporation is carried out in a vacuum under controlled oxygen partial pressure or controlled oxygen gas flow.

The method is advantageous because it enables an application of a homogenous protective coating since as a result of the evaporation of the material in oxygen atmosphere at least one homogenous layer can be applied as oxide in only one method step. Time-consuming aftertreatment is unnecessary. If necessary, additional treatments by cooling air holes, which can be provided in the structure, are required but involve only a low outlay.

The target preferably comprises chromium metal in addition. With this, an aluminum-chromium target is evaporated in the reactive CAE. The proportion of chromium in the target requires the forming of a corundum structure in a forming Al—Cr—O mixed crystal, in fact already at relatively low temperatures of 500° C. and below. The content of chromium is especially preferably measured in this case so that the lattice constant of the Al—Cr—O mixed crystal structure which is created during the coating is adjusted within the region which lies between corundum and eskolaite. In this case, use is made of Vegard's law according to which the lattice constant of a crystal is linearly dependent on the percentage proportion of the components. Furthermore, a high proportion of chromium is especially advantageous because a protective coating is formed, which protective coating is produced as a result of a diffusion of chromium from a material with high chromium content (protective coating) into a material with low chromium content (thermal barrier coating) and during which the corundum structure of the Al—Cr—O mixed crystal is obtained.

The Al—Cr—O mixed crystal structure can exist in various crystallite sizes which as a result of the process conditions (particularly the chromium content, the oxygen partial pressure which prevails during the coating and the temperature of the substrate, i.e. the thermal barrier coating to which the protective coating is applied) can be influenced during the layer deposition and can be correspondingly controlled. This has the consequence that the deposited layers of the protective coating can depend upon the conditions, e.g. X-ray amorphous, or in other cases can clearly show the corundum structure during an X-ray analysis, wherein the positions of the Bragg Peaks of the chromium content correspondingly lie between those of the pure corundum and those of the eskolaite.

Furthermore, the target preferably comprises additional elements selected from the group comprising titanium, hafnium, silicon and zirconium. Further elements can also be contained in the target in order to benefit specific properties. The elements are selected to adapt to the material to be coated or for influencing specific properties of the layer which is to be produced. In order to create an essentially homogenous layer in the sense of the embodiments of the invention, the solubility limit of the aforesaid additional elements in aluminum should not be noticeably exceeded. In other words, the concentration of the elements can be at such level that their solubility limit in aluminium is just about achieved, but not higher as far as possible. Alternatively, the concentrations of the additional elements can lie at a higher level in order to adapt the properties of the material to specified requirements, e.g. in order to adapt the thermal expansion coefficients of the synthesized layer and of the subjacent material of the thermal barrier coating to each other.

The temperature of the substrate during the coating is preferably at least 200° C. Furthermore, the temperature of the substrate during the coating is preferably around 600° C.

The thickness of the applied protective coating lies preferably between 5 and 500 μm. In this case, the thickness is selected in dependence of the quality of the surface of the layer on which the protective coating is arranged, particularly the surface of the thermal barrier coating.

In a further preferred embodiment of the method, at least one first and one second layer is applied for producing the protective coating. Three layers can even be applied.

It is also preferred if during the depositing of the layer a gradient is produced in the chemical composition of the protective coating. The reactive CAE advantageously enables the producing of a gradient between the thermal barrier coating, or a material applied to the thermal barrier coating, and a corundum structure of the protective coating according to the embodiments of the invention. The gradient can also exist in one layer. When producing a protective coating from a plurality of layers, one structure can therefore be merged into another structure via a gradient. This process advantageously allows a targeted design of a protective coating, especially consisting of a plurality of layers, with regard to its chemical composition, which protective coating is to be arranged on a substrate which is to be protected against hot gas erosion.

A second aspect of the embodiments of the invention relates to a protective coating which has been produced by means of a method according to the embodiments of the invention. The protective coating according to the embodiments of the invention therefore has a homogenous layer consisting of aluminum oxide, preferably Al—Cr—O mixed crystals, and is applied by means of reactive cathodic arc evaporation.

A third aspect of the embodiments of the invention relates to a component of a gas turbine having a protective coating according to the embodiments of the invention. The component therefore has a thermally stressed structure in the sense of the embodiments of the invention, or it is this thermally stressed structure. The protective coating according to the embodiments of the invention is for example on combustion chamber parts or blades of a gas turbine.

A fourth aspect of the embodiments of the invention relates to a gas turbine having at least one component according to the embodiments of the invention. The gas turbine according to the embodiments of the invention therefore has at least one component, e.g. a combustion chamber part or a blade, which has a thermal barrier coating, to which is applied a protective coating according to the embodiments of the invention.

BRIEF DESCRIPTION

Some of the embodiments will be described in detail, with reference to the following figures, wherein like designations denote like members, wherein:

FIG. 3 shows a flow diagram of an embodiment of a method.

DETAILED DESCRIPTION

Figure 1:
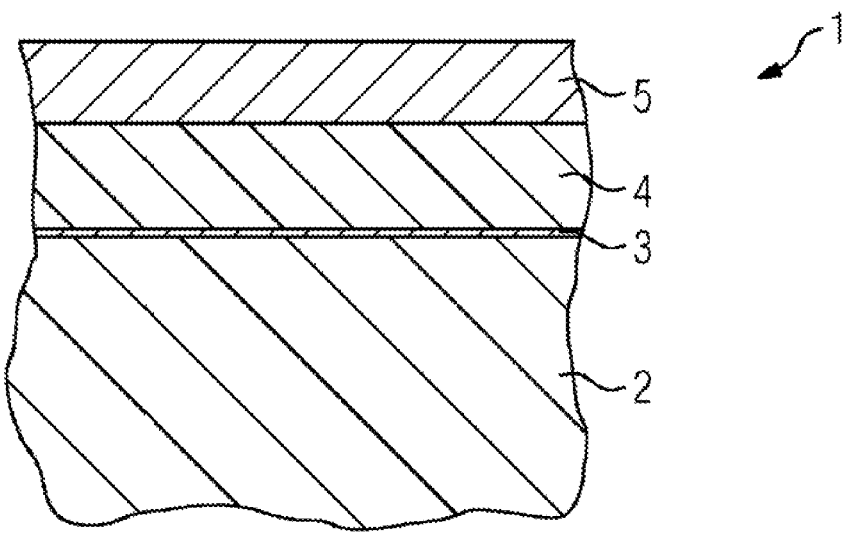
FIG. 1 shows a schematic view of an embodiment of a component with an embodiment of a protective coating.

In the embodiment shown in FIG. 1, a layer system 1 has a base material 2 of a component. A metallic adhesive layer 3 of the MCrAlY type is arranged directly on the base material 2. M in this alloy typically stands for at least one metal from the group which includes iron, cobalt and nickel. As an alternative to yttrium (Y), another element, preferably a rare earth element, can be used in the alloy. As an alternative to the MCrAlY type, a diffusion coating such as diffusion aluminide or diffusion aluminide modified with platinum can be used as the adhesive layer 3.

A thermal barrier coating 4 is arranged on the adhesive layer 3. The thermal barrier coating comprises a ceramic material, e.g. yttrium oxide-stabilized zirconium dioxide or gadolinium oxide-stabilized zirconium oxide. The thermal barrier coating 4 can also comprise both yttrium oxide-stabilized zirconium dioxide and gadolinium oxide-stabilized zirconium oxide.

A protective coating 5, which in the exemplary embodiment according to FIG. 1 consists of one layer, is arranged on the thermal barrier coating 4. The protective coating 5 in one embodiment is a homogenous layer consisting of α-aluminum oxide, also referred to as a corundum structure. In a further embodiment, the layer comprises chromium. In this case, the corundum structure consists of an Al—Cr—O mixed crystal. Depending on the chromium content, chromium diffuses from a layer with high chromium content into a layer with low chromium content, wherein the corundum structure of the Al—Cr—O mixed crystal is obtained. As an example of a diffusion from the protective coating 5 into the thermal barrier coating 4, this means that a $(Al_{0.99}Cr_{0.01})_2O_3$ layer is formed from a $(Al_{0.7}Cr_{0.3})_2O_3$ layer. This transformation is with a temperature-dependent color change of the layer from an original dark gray coloring to a green and then to a red coloring. In an X-ray crystal structure analysis the transition from the mixed crystal to the so-called noble corundum (ruby) can be revealed in this case.

Figure 2:
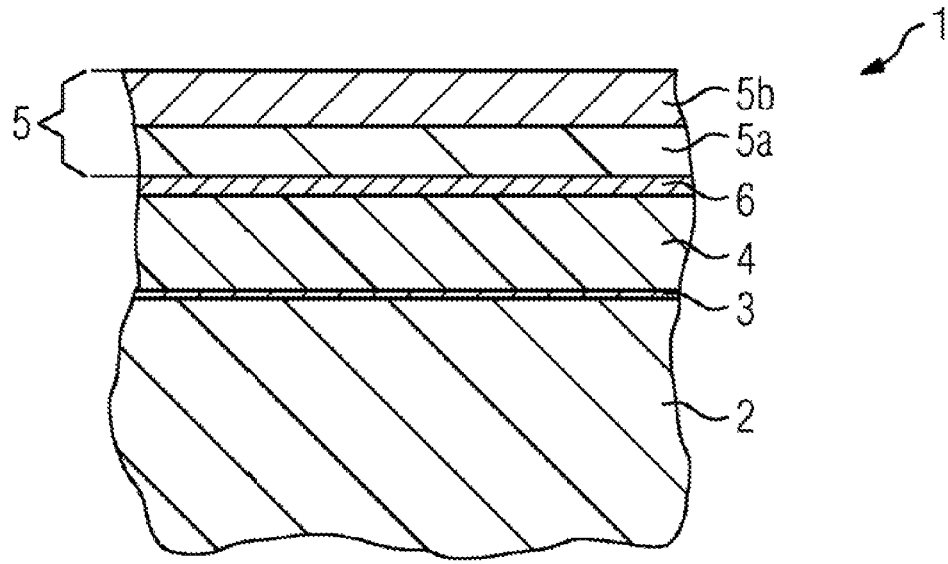
FIG. 2 shows a schematic view of an embodiment of a component with a further embodiment of the protective coating.

In the exemplary embodiment according to the view of FIG. 2, the protective coating 5 consists of a first layer 5a and a second layer 5b. In addition, an adhesive layer 6 is arranged on the thermal barrier coating 4, on which is again arranged the protective coating 5. The adhesive layer 6 is formed for example by means of evaporation of a zirconium-yttrium target. Arranged on this adhesive layer is the first layer 5a, which comprises a composition of Al—Zr—O or Al—Zr (Cr)—O, i.e. with this first layer 5a between the thermal barrier coating 4 and the protective coating 5, a materially-adapted transition to the second layer 5b is created by means of the reactive CAE method, which second layer has an Al—Zr—O corundum structure or an Al—Zr—Cr—O corundum structure. In this case, the layers are not strictly delimited by each other but merge into each other, wherein they have differences with regard to the concentration of added metals such as zirconium and chromium, or in other words have a gradient. In this case, the reactive CAE method is extremely well suited to allowing the layers to merge into each other via a gradient.

In a method for arranging the protective coating 5 according to the embodiment according to FIG. 1 by means of reactive CAE, in a first step S1 a thermally stressed structure is provided in a coating chamber. The thermally stressed structure is for example a blade of a gas turbine or a combustion chamber part. The coating chamber is in the main a vacuum chamber, but into which oxygen can be introduced as the reactive gas in order to deposit an oxide on the substrate.

In a second step S2, a target is provided as the material source for the protective coating 5 which is to be formed, wherein the target comprises at least aluminum. Furthermore, the target preferably comprises chromium, and/or, according to choice, other elements such as zirconium, titanium, hafnium and/or silicon.

In a third step S3, a controlled quantity of oxygen is introduced into the coating chamber. In this case, the person skilled in the art selects a determined, suitable partial pressure of the oxygen.

In a fourth step S4, an arc is ignited so that the material of the target is evaporated. The evaporated target elements react with the oxygen forming an oxide which is deposited on the outer side of the thermal barrier coating 4 of the thermally stressed structure so that the coating being applied is an oxide layer, ideally an Al—Cr—O layer. The target, e.g. an aluminum-chromium target for producing an Al—Cr—O layer, acts as a cathode, and the wall of the coating chamber acts as an anode. In addition, a negative potential is applied to the substrate, e.g. to the thermal barrier coating 4 of the thermally stressed structure, in order to direct the ionized material vapor toward the substrate. The evaporated material condenses on the surface of the thermal barrier coating and is deposited forming a layer which forms the protective coating 5.

For arranging the protective coating 5 according to the embodiment of FIG. 2, different targets are provided, from which material for the different layers is separated out. Therefore, for example a zirconium-yttrium target is provided for the adhesive layer 6, an aluminum-chromium-zirconium target is provided for the first layer 5a and an aluminum-chromium target is provided for the second layer 5b. The concentration of the elements in the targets differs depending on the desired concentration in the layers which are to be formed or of a gradient which is to be created between the layers. A gradient can also exist within one layer. In this case, the described procedure is conducted by the steps S2 to S4 for each individual layer. For this, the coating chamber can be ventilated between the applications of the individual layers so that the target can be exchanged and the coating chamber can then be pumped out again to the desired vacuum. The coating plant can, however, be designed so that it contains all the targets from the start of the coating process and these can be used in accordance with the desired coating sequence without a break in the vacuum.

In addition to reactive CAE, other methods are also suitable for applying the layers of the protective coating. Possible methods, which can be used alternatively and/or in combination with the aforesaid methods, are for example sputtering processes, thermal evaporation, electron beam evaporation, laser beam evaporation or electric arc evaporation.

Although the invention has been illustrated and described in greater detail with reference to the_preferred_exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for arranging a protective coating comprising at least one layer with aluminum oxide content on a thermally stressed structure by means of cathodic arc evaporation, wherein the thermally stressed structure comprises at least one thermal barrier coating made of a ceramic material, the method comprising:
   S1) providing the thermally stressed structure in a coating chamber;
   S2) providing a target as a source material for the at least one layer in the coating chamber, wherein the target comprises at least aluminium;
   S3) providing a controlled oxygen partial pressure in the coating chamber; and
   S4) igniting an arc so that material of the target is evaporated, which material is deposited on an outer side of the thermal barrier coating of the thermally stressed structure,
   wherein the ceramic material of the thermal barrier comprises yttrium oxide-stabilized zirconium dioxide and/or gadolinium oxide-stabilized zirconium oxide, and
   where the protective coating is applied as a homogeneous alpha-aluminum oxide layer, with the target additionally comprising chromium, wherein a content of chromium is measured so that the lattice constant of at least one Al—Cr—O mixed crystal which is created during the coating is adjusted within the range which lies between corundum and eskolaite.

2. The method as claimed in claim 1, wherein the target additionally comprises elements selected from the group consisting of: titanium, hafnium, silicon, and zirconium.

3. The method as claimed in claim 1, wherein a temperature of the substrate is at least 200° C.

4. The method as claimed in claim 1, wherein the substrate temperature is approximately 600° C.

5. The method as claimed in claim 1, wherein a thickness of the applied protective coating lies between 5 and 500 µm.

6. The method as claimed in claim 1, wherein a gradient is produced in the chemical composition of the protective coating.

7. The method as claimed in claim 1, further comprising applying the protective coating directly onto the at least one thermal barrier coating made of ceramic.

8. The method as claimed in claim 1, wherein an adhesive layer is located between the at least one thermal barrier coating made of ceramic and the protective coating.

9. The method as claimed in claim 1, further comprising providing a zirconium yttrium target for the adhesive layer.

* * * * *